(12) United States Patent
Jalal et al.

(10) Patent No.: US 11,592,417 B1
(45) Date of Patent: Feb. 28, 2023

(54) FUEL CELL SENSORS AND METHODS OF USING AND FABRICATING THE SAME

(71) Applicants: Ahmed Hasnain Jalal, Miami, FL (US); Arif I. Sarwat, Miami, FL (US)

(72) Inventors: Ahmed Hasnain Jalal, Miami, FL (US); Arif I. Sarwat, Miami, FL (US)

(73) Assignee: THE FLORIDA INTERNATIONAL UNIVERSITY BOARD OF TRUSTEES, Miami, FL (US)

(*) Notice: Subject to any disclaimer, the term of this patent is extended or adjusted under 35 U.S.C. 154(b) by 0 days.

(21) Appl. No.: 17/660,865

(22) Filed: Apr. 27, 2022

(51) Int. Cl.
| | | |
|---|---|---|
| *G01N 27/401* | (2006.01) | |
| *G01N 27/407* | (2006.01) | |
| *G01N 27/416* | (2006.01) | |
| *C23C 14/34* | (2006.01) | |
| *H01M 8/0444* | (2016.01) | |
| *C23C 14/20* | (2006.01) | |
| *C23C 14/02* | (2006.01) | |
| *H01M 4/04* | (2006.01) | |
| *H01M 4/88* | (2006.01) | |
| *H01M 8/1004* | (2016.01) | |
| *H01M 8/1011* | (2016.01) | |

(52) U.S. Cl.
CPC ....... *G01N 27/4071* (2013.01); *C23C 14/021* (2013.01); *C23C 14/205* (2013.01); *C23C 14/34* (2013.01); *G01N 27/4075* (2013.01); *G01N 27/4163* (2013.01); *H01M 4/0426* (2013.01); *H01M 4/8817* (2013.01); *H01M 8/0444* (2013.01); *H01M 8/1004* (2013.01); *H01M 8/1011* (2013.01)

(58) Field of Classification Search
CPC ........... G01N 27/4071; G01N 27/4075; G01N 27/4163; C23C 14/021; C23C 14/205; C23C 14/34; H01M 4/0426; H01M 4/8817; H01M 8/0444; H01M 8/1004; H01M 8/1011
See application file for complete search history.

(56) References Cited

U.S. PATENT DOCUMENTS

| | | | | |
|---|---|---|---|---|
| 5,635,039 A | * | 6/1997 | Cisar | ................. B01J 8/009 204/252 |
| 5,650,054 A | * | 7/1997 | Shen | ................. G01N 27/4045 205/781 |
| 9,816,959 B2 | | 11/2017 | Umasankar et al. | |

(Continued)

OTHER PUBLICATIONS

Kulikovsky et al., "Positioning of a Reference Electrode in a PEM Fuel Cell," Journal of The Electrochemical Society, 162 (8) F843-F848 (2015) (Year: 2015).*

(Continued)

*Primary Examiner* — Alexander S Noguerola
(74) *Attorney, Agent, or Firm* — Saliwanchik, Lloyd & Eisenschenk (57) ABSTRACT

Flexible fuel cell sensors and methods of making and using the same are provided. A fuel cell sensor can be used for the detection of, for example, isopropyl alcohol (IPA), and the working mechanism of the fuel cell sensor can rely on redox reactions. The fuel cell sensor can include a proton exchange membrane (PEM), an anode disposed on a first surface of the PEM, a cathode disposed on a second surface of the PEM opposite from the first surface, and a reference electrode disposed on the first surface of the PEM and spaced apart from the anode.

19 Claims, 3 Drawing Sheets

(56) References Cited

U.S. PATENT DOCUMENTS

| | | |
|---|---|---|
| 10,712,306 B2 | 7/2020 | Umasankar et al. |
| 2011/0048943 A1* | 3/2011 | Nemes ............... H01M 4/9083 |
| | | 204/415 |
| 2017/0184537 A1* | 6/2017 | Umasankar ........ G01N 27/4163 |

OTHER PUBLICATIONS

Klaus-Dieter Kreuer, "Proton Conductivity: Materials and Applications," Chem. Mater. 1996, 8, 610-641 (Year: 1996).*

PalmSens web article "Tafel Plot and Evans Diagram" downloaded Jul. 14, 2022, from https://www.palmsens.com/knowledgebase-article/tafel-plot-and-evans-diagram/ (Year: 2022).*

Jalal et al., "A Model for Safe Transport of Critical Patients in Unmanned Drones with a 'Watch' Style Continuous Anesthesia Sensor," Journal of the Electrochemical Society, 165 (8) B 3071-B3077 (2018) (Year: 2018).*

Wendt et al., Electrocatalysis and Electrocatalysts for Low Temperature Fuel Cells: Fundamentals, State of the Art, Research and Development, Quim. Nova, vol. 28, No. 6, 1066-1075, 2005, 10 pages.

Choi et al., Highly conductive, stretchable and biocompatible Ag—Au core-sheath nanowire composite for wearable and implantable bioelectronics, Nature Nanotechnology, vol. 13, Nov. 2018, 1048-1056, 10 pages.

Srejic et al., Oxygen Reduction on Au(100)-like Polycrystalline Gold Electrode in Alkaline Solution, Int. J. Electrochem. Sci., 11 (2016) 10436-10448, 14 pages.

A. A. Kulikovsky, Potentials Near a Curved Anode Edge in a PEM Fuel Cell: Analytical Solution for Placing a Reference Electrode, Journal of The Electrochemical Society, 162 (10) F1191-F1198 (2015), 9 pages.

A. A. Kulikovsky et al., Positioning of a Reference Electrode in a PEM Fuel Cell, Journal of The Electrochemical Society, 162 (8) F843-F848 (2015), 7 pages.

R. Sigwadi et al., The proton conductivity and mechanical properties of Nafion®/ ZrP nanocomposite membrane, Heliyon 5 (2019) e02240, 9 pages.

A. M. Sheikh et al., On reviewing the catalyst materials for direct alcohol fuel cells (DAFCs), Journal of Multidisciplinary Engineering Science and Technology (JMEST), vol. 1, Issue 3, Oct. 2014, 10 pages.

Muhammet Erkan Kose et al., Principal Component Analysis Calibration Method for Dual-Luminophore Oxygen and Temperature Sensor Films: Application to Luminescence Imaging, Langmuir 2005, 21, 9110-0120, 11 pages.

Klaus-Dieter Kreuer, Proton Conductivity: Materials and Applications, Chem. Mater. 1996, 8, 610-641; 32 pages.

Yulia Sergeevna Sedesheva et al., Proton-Exchange Membranes Based on Sulfonated Polymers, Oriental Journal of Chemistry, 2016, vol. 32, No. (5); p. 2283-2296, 14 pages.

Pyoungho Choi et al., Thermodynamics and Proton Transport in Nafion II. Proton Diffusion Mechanisms and Conductivity, Journal of the Electrochemical Society, 152 (3) E123-E130 (2005), 8 pages.

Colleen Spiegel, Mathematical modeling of polymer exchange membrane fuel cells, Graduate Theses and Dissertations, University of South Florida, 2008, 379 pages.

* cited by examiner

FUEL CELL SENSORS AND METHODS OF USING AND FABRICATING THE SAME

BACKGROUND

Isopropyl alcohol (IPA) is extensively employed as a chemical raw material in several industrial production areas, including cosmetics, pharmaceuticals, lacquers, dyes, antifreeze, preservatives, and detergents. According to Occupational Safety and Health Administration (OSHA) and National Institute for Occupational Safety and Health (NIOSH), IPA is considered to be a toxic and hazardous volatile compound to humans. More importantly, it can penetrate through the human epidermis, and IPA in a concentration above 400 parts per million (ppm) may injure the optic nerve, retina, and upper respiratory tract. Moreover, exposure to a high concentration of IPA can cause nausea, headache, dizziness, loss of coordination, unconsciousness, shocks, faintness, and/or death. Inhalation of IPA can also irritate the nose and throat, and direct contact with IPA can irritate and burn the eyes and skin. As with other alcohols, IPA is also highly flammable in the presence of sparks, heat, or any open flame. Such a flammable compound can cause explosions during any of these exposures.

BRIEF SUMMARY

In view of the above concerns regarding isopropyl alcohol (IPA), there is great interest in detecting IPA with accuracy, precision, and real-time occupational safety and health concerns. Embodiments of the subject invention provide novel and advantageous fuel cell sensors and methods of making and using the same. A fuel cell sensor can be used for the detection of, for example, IPA, and the working mechanism of the fuel cell sensor can rely on redox reactions. The fuel cell sensor can include a proton exchange membrane (PEM), an anode disposed on a first surface of the PEM, a cathode disposed on a second surface of the PEM opposite from the first surface, and a reference electrode (e.g., disposed on the first surface of the PEM). The anode and the reference electrode can be spaced apart from each other, for example by a minimum gap. The fuel cell sensor can be flexible (i.e., not rigid; able to be bent significantly without breaking or fracturing).

In an embodiment, a fuel cell sensor can comprise: a PEM; an anode disposed on a first surface of the PEM; a cathode disposed on a second surface of the PEM opposite from the first surface; and a reference electrode disposed on the first surface of the PEM; where the fuel cell sensor is flexible. The reference electrode can be spaced apart from the anode (e.g., by a minimum distance as calculated using Equation (1) herein). A length of the cathode can be the same as a length of the PEM, and a width of the cathode can be the same as a width of the PEM. A thickness of the PEM can be at least five times larger than each of a thickness of the anode, a thickness of the cathode, and a thickness of the reference electrode. A cross-section of the anode, taken in a direction parallel to the first surface of the PEM, can have a parabolic shape. The anode can be a thin-film anode, the cathode can be a thin-film cathode, and/or the reference electrode can be a thin-film reference electrode. Each of the anode and the cathode can comprise platinum (Pt), gold (Au), nickel (Ni), ruthenium (Ru), an oxide of any of these, or any combination thereof. For example, each of the anode and the cathode can comprise or can be Au. The PEM can comprise (or can be), for example, Nafion.

In another embodiment, a sensing system can comprise: a fuel cell sensor as described herein; a processor in operable communication with the fuel cell sensor; and a machine-readable medium in operable communication with the processor and having instructions stored thereon that, when executed by the processor, perform the following steps: receiving sensing data of the fuel cell sensor; performing a principal component regression (PCR) multivariate method to establish a relationship among response and predictor variables of calibration data of an analyte to be sensed by the fuel cell sensor; performing a principal component analysis (PCA) to reduce redundancy and outliers of the predictor variables and to give PCA predictor variables and covariates; converting the PCA predictor variables into latent variables; and performing multiple regression steps among the covariates.

In another embodiment, a method of sensing an analyte (e.g., IPA) can comprise: providing a solution of the analyte (e.g., an IPA solution) to a lower portion of a chamber; disposing a fuel cell sensor as described herein in an upper portion of the chamber; closing off the chamber; allowing vapor of the analyte (e.g., IPA vapor) formed from the solution of the analyte (e.g., IPA solution) to reach the fuel cell sensor; and measuring a current through the fuel cell sensor to determine a concentration of the analyte (e.g., an IPA concentration) in the solution of the analyte (e.g., IPA solution).

In another embodiment, a method of fabricating a fuel cell sensor can comprise: providing a PEM; and sputter-coating nanoparticles on the PEM to form an anode on a first surface of the PEM, a cathode on a second surface of the PEM, and a reference electrode on the first surface of the PEM spaced apart from the anode; where the fuel cell sensor is flexible. The anode can be a thin-film anode, the cathode can be a thin-film cathode, and/or the reference electrode can be a thin-film reference electrode. The method can further comprise, before proving the PEM, cleaning the PEM by boiling the PEM in peroxide. A length of the cathode can be the same as a length of the PEM; a width of the cathode can be the same as a width of the PEM; a thickness of the PEM can be at least five times larger than each of a thickness of the anode, a thickness of the cathode, and a thickness of the reference electrode; a cross-section of the anode, taken in a direction parallel to the first surface of the PEM, can have a parabolic shape; and/or the reference electrode can be spaced apart from the anode (e.g., by a minimum distance as calculated using Equation (1) herein). The nanoparticles can be, for example, nanoparticles of Pt, Au, Ni, Ru, an oxide of any of these, or any combination thereof. For example, the nanoparticles can be Au nanoparticles such that the anode comprises (or is) Au, the cathode comprises (or is) Au, and/or the reference electrode comprises (or is) Au. The PEM can comprise (or can be), for example, Nafion.

DETAILED DESCRIPTION

Embodiments of the subject invention provide novel and advantageous fuel cell sensors (can also be referred to as fuel cell sensors) and methods of making and using the same. A fuel cell sensor can be used for the detection of, for example, isopropyl alcohol (IPA), and the working mechanism of the fuel cell sensor can rely on redox reactions. The fuel cell sensor can include a proton exchange membrane (PEM), an anode disposed on a first surface of the PEM, a cathode disposed on a second surface of the PEM opposite from the first surface, and a reference electrode (e.g., disposed on the first surface of the PEM). The anode and the reference electrode can be spaced apart from each other, for example by a minimum gap (see, e.g., $L_{gap}$ in FIG. 1). The fuel cell sensor can be flexible (i.e., not rigid; able to be bent significantly without breaking or fracturing). The PEM can be Nafion, though embodiments are not limited thereto. Also, the anode and/or cathode can comprise gold (Au), such as a thin-film (e.g., thickness in a range of 20 nanometer (nm) to 100 nm) gold material. Au is advantageous for catalyst electrodes due to its high conductivity and biocompatibility.

There are no related art flexible, fuel-cell-based sensors available for IPA sensing. The sensors of embodiments of the subject invention are flexible in nature and can fit several form factors, for example in the wearable platform or cloths. The sensors of embodiments of the subject invention also provide improved current density and reduced size and thickness (e.g., in nanoscale) compared to related art sensors. The sensors of embodiments of the subject invention are sensitive to detect the physiological range of IPA. A principal component regression (PCR) algorithm can be employed to provide reliable and accurate IPA measurements with the sensor.

Figure 1:
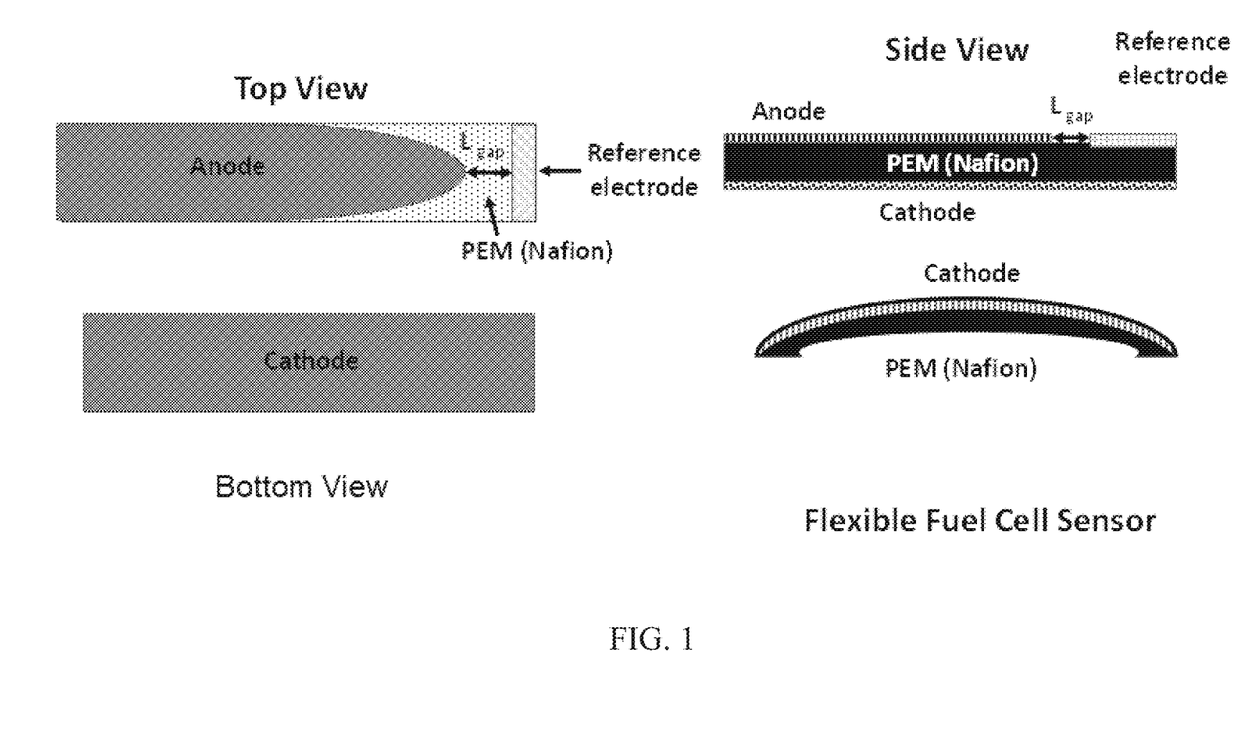
FIG. 1 shows a schematic view of a fuel cell sensor, according to an embodiment of the subject invention.

FIG. 1 shows a schematic view of a fuel cell sensor, according to an embodiment of the subject invention. Referring to FIG. 1, the fuel cell sensor can comprise a membrane electrode assembly (MEA) comprising a PEM, an anode disposed on a first surface of the PEM, a cathode disposed on a second surface of the PEM opposite from the first surface, and a reference electrode disposed on the first surface of the PEM and spaced apart from the anode by a minimum gap $L_{gap}$. In this way, the PEM electrolyte material is sandwiched between the anode and the cathode. Though FIG. 1 lists Nafion as the PEM, this is for exemplary purposes only and should not be construed as limiting. The PEM can have a thickness that is much larger (e.g., at least 5 times larger) than a thickness of each of the anode, the cathode, and the reference electrode. Different catalyst materials (e.g., metals and/or metal oxides) can be included to expedite the redox reaction at the electrodes. During sensing, the analyte to be detected (e.g., IPA) can be oxidized on the anodic side while oxygen is reduced on the cathode. The PEM carries the generated electrically charged ions (proton, H$^+$ ions) from the anode to the cathode in the presence of H$_2$O molecules. In one embodiment, the PEM material can be flexible Nafion perfluorinated membrane 424 reinforced with polytetrafluoroethylene (PTFE) fiber as an electrolyte that allows transporting protons from the anode to the cathode. During sensing, the presence and/or concentration of the analyte to be detected (e.g., IPA) is determined by measuring the current through the sensor (e.g., through the PEM or from cathode to anode) when the sensor is applied to a sample having (or potentially having) the analyte (or the sample is applied to the sensor). Also, the analyte can be part of a liquid or a vapor.

The catalyst can be, for example, platinum (Pt), gold (Au), nickel (Ni), ruthenium (Ru), an oxide of any of these, or any combination thereof, though embodiments are not limited thereto. In some embodiments, Au can be used as material for catalyst electrodes due to its conductivity and biocompatibility.

In many embodiments, a PCR algorithm can be used with the fuel cell sensor. For example, the PCR algorithm can be operated on a computing machine having a processor and a (non-transitory) machine-readable medium having instructions stored thereon that, when executed by the processor, perform the steps of the PCR algorithm. The processor can be in operable communication with the fuel cell sensor, such that it can receive data (e.g., sensing data when in the possible presence of an analyte (e.g., IPA)) therefrom. With regression fittings, the PCR algorithm can offset the fuel cell sensor's noise and improve its calibration model. Also, the PCR algorithm can correlate larger data sets and accurate fitting among identified and unidentified variables. The PCR algorithm is a multivariate regression method that establishes a relationship among response and predictor variables of analyte (e.g., IPA) calibration data. Redundancy and outliers of the predictor variables can be reduced by principal component analysis (PCA). Later, the corresponding variables can be converted into latent variables. Last, several regression steps can be executed among the scores of covariates attained in the PCA. This predefined predictive and regression model promotes better fitting of any test or unknown data. Hence, refinement of the calibration model of the fuel cell sensor can be obtained using PCR. The derived model can be used to determine the analyte (e.g., IPA) concentration in real-time (e.g., to provide occupational safety in the case of IPA being the analyte).

A three-electrode fuel cell sensor can be used, and the length and width dimensions of the cathode and the PEM can be the same. The anode can have a parabolic shape (cross-sectional shape taken perpendicular to the thickness direction), with a sharp or relatively sharp tip to provide a radial distribution of membrane potential ($\Phi^+$) with a distance ($L_{gap}$) between the reference electrode (RE) and the tip of the anode (as shown in FIG. 1). The shortest distance between the anode and the RE ($L_{gap}$) can be estimated using Equation (1), where Ra is equal to the radius of curvature of the tip of the anode.

$$L_{gap} = \frac{\pi \lambda_D}{2} \left[ \ln\left( \frac{67}{18 \left(\frac{R_a}{\lambda_D}\right)^{\frac{7}{45}}} \right) \right]^{-1} \quad (1)$$

Here, $\lambda_D$ is Debye length and $L_{gap}$ is maintained to prevent or inhibit an edging effect.

$$\lambda_D = \left[ \frac{\sigma_m b l_m}{2 j_{ox}} \right]^{-1/2} \quad (2)$$

Here, $\sigma_m$ is the proton conductivity of the bulk membrane (e.g., the PEM), b is the oxygen reduction reaction (ORR) Tafel slope, $l_m$ is the membrane thickness (e.g., of the PEM), and $j_{ox} = l_t i$ is the superficial ORR exchange current density (in Amperes per square centimeter (A/cm$^2$)). Here, $l_t$ is the membrane thickness, and i is the volumetric ORR exchange current density (in Amperes per cubic centimeter A/cm$^3$)).

The anode and the RE can be on the same side of the PEM, and the cathode can be a counter electrode alone on the opposite side of the PEM. The area of the anode (can be referred to as a working electrode) can be smaller than that of the cathode (e.g., can be 80% or less than the area of the cathode) to avoid the effect of limitation of the ORR (e.g., compared to propanol oxidation on the anode in the case of IPA being the analyte). The area of the reference electrode area can be much smaller than that of both the anode and the cathode (e.g., 15% or 10% or less of the area of the anode).

In an embodiment, Nafion can be used as the PEM. As with other perfluorinated ionomers, Nafion is preventive to (or inhibiting of) any chemical reaction. It has high-phased isolated morphology that enhances proton conductivity with moderate (e.g., around 30%) water molecule uptake. Moreover, the hydrophilic sulfonic acid group governs the kinetics of proton transfer through it. Nafion can be cleaned by boiling in peroxide to remove organics or acid before starting the fabrication process, and this also ensures proton formation. Later, gold nanoparticles can be sputter-coated (e.g., at a pressure of 35 millibar (mBar) and a current of 30 milliamps (mA) for 50 seconds at 5 times each using an Au coating (e.g., Microscopy Au Sample Coating from PELCO SC-7)).

Within the PEM, the hydrophilic sulfonic acid group governs the kinetics of proton transfer through it, where the transport mechanism can be explained by the widely accepted cluster channel model (see, e.g.; Wasmus et al., Methanol oxidation and direct methanol fuel cells: a selective review, J. Electroanal. Chem., vol. 461, no. 1-2, pp. 14-31, 1999; and Sedesheva et al., Proton-exchange membranes based on sulfonated polymers, Oriental J. of Chem., vol. 32, pp. 2283-2296, 2016; both of which are hereby incorporated herein by reference in their entireties). In this model, the sulfonated acid groups form water-filled clusters over which the protons transport. From this model, it can be inferred that protons can transport across the Nafion membrane only under the conditions of an optimum hydration level. The conductivity of these ions is proportionally related to relative humidity (RH) and the environment's temperature (i.e., the ambient temperature). This supports the claim that a change in RH (at constant temperature) leads to a linear change in ionic conductivity. Proton conductivity ($\sigma$) in polyelectrolytes (e.g., Nafion) also depends on temperature $\sigma T = \sigma_0 * (e^{(E_a/kT)})$ and the hydrophilic volume fraction, $\sigma \sim (\varphi - \varphi_c)^2$. This volume fraction can also share a quadratic relation with the diffusion of water molecules, $D_w \sim \varphi^2$. $H_2O$ diffusion flux ($J_{H2O}$) is generally controlled by electro-osmotic drag (EOD), diffusion, and applied electric force. The diffusion of $H^+$ ions is governed by the Grotthuss mechanism, en masse diffusion, and surface diffusion. Hence, the overall membrane conductivity, $\sigma_{H+}$ was found from Nernst's equation as Equation (3).

$$\sigma_{H+} = \frac{\varepsilon_i}{\tau}\left[\frac{F^2}{RT}\left(D^{\Sigma}_{H+} C^{\Sigma}_{H+} + D^G_{H+} C^C_{H+} + \frac{D^W_{H+}}{1+\delta_c} C_{H+}\right)\right] \quad (3)$$

where $\varepsilon_i$ is the molar fraction of the water per acidic chain, and $\tau$ is the tortuosity factor of the pore. In equation (3), $C^{\Sigma}_{H+}$ and $C_{H+}$ are the surface and bulk membrane distribution of the proton concentration, respectively. The surface, en masse, and Stefan-Maxwell diffusion coefficients of the hydronium ions are $D^{\Sigma}_{H+}$, $D^G_{H+}$, and $D^W_{H+}$, respectively.

A PEM galvanic cell mechanism relies mainly on the redox reaction, which takes place at the outer surface of the anode and cathode. The capacity of this reaction depends on the catalyst materials. The rate of these reactions is a function of the hydration of the membrane and its capacity to carry the protons from the anode to the cathode through it. The complete redox reactions are as shown in Equations (4), (5), and (6).

$$CH_3CHOHCH_3 + H^+ \rightarrow C_3H_6O \quad (4)$$

$$C_3H_6O = 3H_2O \rightarrow 8H^+ + 8e^- + CH_3COOH + CO_2 \quad (5)$$

$$2O_2 + 8H^+ + 8e^- \rightarrow 4H_2O \quad (6)$$

Consequently, acetic acid ($CH_3COOH$) is produced in the anode, and the $H^+$ ions pass over the PEM from the anode to the cathode. The electrons drift over the external circuitry simultaneously. The mechanism of the three electrode fuel cell system for the amperometric measurement relies on the principles of galvanic and electrolytic cell systems. The mechanism of electron flow from anode to cathode follows the galvanic cell principle. The applied potential between the RE and anode (e.g., −0.05 Volts (V) or about −0.05 V) can follow the electrolytic cell principle to enhance oxidation reaction in the presence of propanol. A high impedance can be maintained between the anode and the RE of the fuel cell. This high impedance not only ensures the flow of faradic current from the anode to the cathode, but also avoids or inhibits the polarization of the RE. The electromotive force (EMF) induces this faradic current, given by the Nernst equation (Equation (7)).

$$E = E_0 - \frac{RT}{nF} \ln Q_r \quad (7)$$

where E is the half-cell potential, $E_0$ is the standard potential, F is the Faraday constant, R is the molar gas constant, n is the number of electrons transferred, T is temperature, and $Q_r$ is the reaction quotient. Here, $E_0$ drives the faradic current in the presence of the target analyte. This current relies on the following factors: applied potential across the electrodes; the open circuit potential (OCP) of the reactions; and the rate of the reaction. This design ensures only the measurement of current from cathode to anode and provides a stable current signal.

The standardization of the measurements can be achieved through step by step evaluation. The steps involved can be: 1) steady-state study of the sensor response for various concentrations of the analyte); 2) constructing calibration plots and understating the sensitivity; and 3) studying the sensor response for the low concentrations of analyte. An amperometric method can be used for analyzing the fuel cell sensor properties. In use, a setup can include a chamber having a fluid that may contain the analyte. For example, the chamber can include a liquid that may contain the analyte, and the fuel cell sensor can either be in contact with the liquid or can be spaced apart from the liquid and can receive vapor (e.g., if the chamber is closed). In an embodiment, a liquid can be at the bottom of the chamber, which has a closed headspace at the top, and the sensor can be disposed at or near the top of the chamber to receive vapor. The concentration of the liquid solution (e.g., the analyte concentration) can be varied to obtain the various concentrations of analyte in the vapor. An experiment can be conducted (e.g., at room temperature and pressure) and repeated several times to obtain the deviation in current (for example about ±30 nanoamps (nA). A calibration plot can be obtained from the experiments, and the sensitivity of the sensor can be determined as well (e.g., 45 picoamps per parts per million per square centimeter (pA/ppm/cm²) or about 45 pA/ppm/cm²). Once the calibration has been performed, then the fuel cell sensor can be more accurately used to determine concentration of the analyte by measuring the current of the sensor when in use.

The methods and processes described herein can be embodied as code and/or data. The software code and data described herein can be stored on one or more machine-readable media (e.g., computer-readable media), which may include any device or medium that can store code and/or data for use by a computer system. When a computer system and/or processor reads and executes the code and/or data stored on a computer-readable medium, the computer system and/or processor performs the methods and processes embodied as data structures and code stored within the computer-readable storage medium.

It should be appreciated by those skilled in the art that computer-readable media include removable and non-removable structures/devices that can be used for storage of information, such as computer-readable instructions, data structures, program modules, and other data used by a computing system/environment. A computer-readable medium includes, but is not limited to, volatile memory such as random access memories (RAM, DRAM, SRAM); and non-volatile memory such as flash memory, various read-only-memories (ROM, PROM, EPROM, EEPROM), magnetic and ferromagnetic/ferroelectric memories (MRAM, FeRAM), and magnetic and optical storage devices (hard drives, magnetic tape, CDs, DVDs); network devices; or other media now known or later developed that are capable of storing computer-readable information/data. Computer-readable media should not be construed or interpreted to include any propagating signals. A computer-readable medium of embodiments of the subject invention can be, for example, a compact disc (CD), digital video disc (DVD), flash memory device, volatile memory, or a hard disk drive (HDD), such as an external HDD or the HDD of a computing device, though embodiments are not limited thereto. A computing device can be, for example, a laptop computer, desktop computer, server, cell phone, or tablet, though embodiments are not limited thereto.

The transitional term "comprising," "comprises," or "comprise" is inclusive or open-ended and does not exclude additional, unrecited elements or method steps. By contrast, the transitional phrase "consisting of" excludes any element, step, or ingredient not specified in the claim. The phrases "consisting" or "consists essentially of" indicate that the claim encompasses embodiments containing the specified materials or steps and those that do not materially affect the basic and novel characteristic(s) of the claim. Use of the term "comprising" contemplates other embodiments that "consist" or "consisting essentially of" the recited component(s).

When ranges are used herein, such as for dose ranges, combinations and subcombinations of ranges (e.g., subranges within the disclosed range), specific embodiments therein are intended to be explicitly included. When the term "about" is used herein, in conjunction with a numerical value, it is understood that the value can be in a range of 95% of the value to 105% of the value, i.e. the value can be +/−5% of the stated value. For example, "about 1 kg" means from 0.95 kg to 1.05 kg.

A greater understanding of the embodiments of the subject invention and of their many advantages may be had from the following examples, given by way of illustration. The following examples are illustrative of some of the methods, applications, embodiments, and variants of the present invention. They are, of course, not to be considered as limiting the invention. Numerous changes and modifications can be made with respect to embodiments of the invention.

Materials and Methods

A fuel cell sensor as disclosed herein, comprising a membrane electrode assembly (MEA), was assembled such that the Nafion electrolyte material was sandwiched between the anode and the cathode. In particular, flexible Nafion perfluorinated membrane 424 reinforced with PTFE fiber from Sigma Aldrich was used as an electrolyte that allows transporting protons from the anode to the cathode. Au was used as the material for the catalyst electrodes due to its greater conductivity and biocompatibility. All the chemicals were used in analytical grade, and IPA was purchased from Fisher Scientific to be used as the test analyte.

Electrodes were imprinted on the flexible Nafion membrane, and Microscopy Au Sample Coating from PELCO SC-7 was used for the Nafion sputter coating of Au nanoparticles. The length and the width of the cathode was the same as that of the Nafion PEM (2.5 centimeters (cm)×1 cm), as shown in FIG. 1. The anode was parabolic in shape, having a sharp tip with a radius (Ra) of curvature of 2 cm. The RE was disposed on the same side of the PEM as the anode, with a shortest distance ($L_{gap}$) between them able to be estimated using Equation (1). The anode (acting as a working electrode) and the RE were on the same side of the PEM and the cathode (acting as a counter electrode) was alone on the opposite side of the PEM (see FIG. 1). The area of the anode was about 2 square centimeters ($cm^2$); and the area of the cathode area was about 2.5 $cm^2$; the area of the RE was 0.2 $cm^2$ (1 cm width×0.2 cm length); and the thickness of the Nafion membrane was 0.03 cm.

Before being used in the fuel cell sensor, the Nafion PEM was cleaned by boiling in peroxide to remove organics or acid before starting the fabrication process. Au nanoparticles were sputter-coated at a pressure of 35 mBar and a current of 30 mA for 50 seconds at 5 times each using the Microscopy Au Sample Coating from PELCO SC-7.

Example 1

Figure 2A:
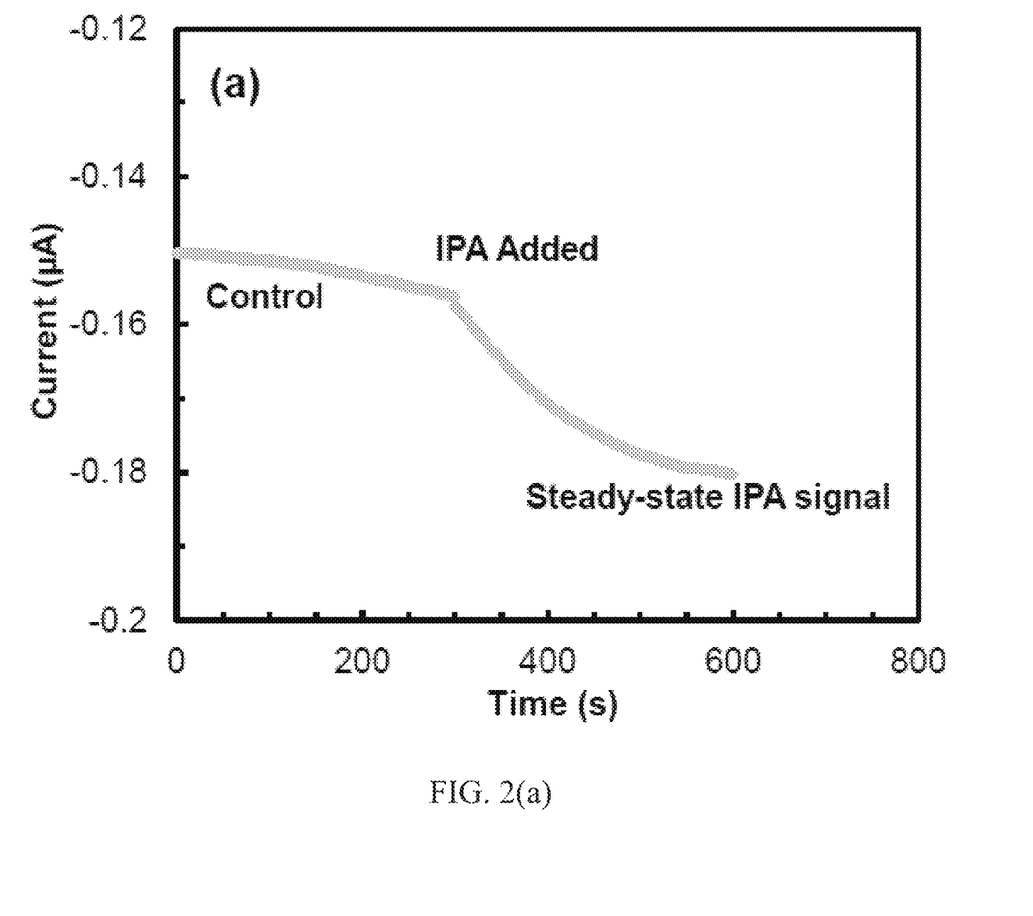
FIG. 2(a) show a plot of current (in microamps ($\mu$A)) versus time (in seconds (s)), showing steady-state amperometric signals of an isopropyl alcohol (IPA) sensor for a concentration of 880 parts per million (ppm) IPA.
Figure 2B:
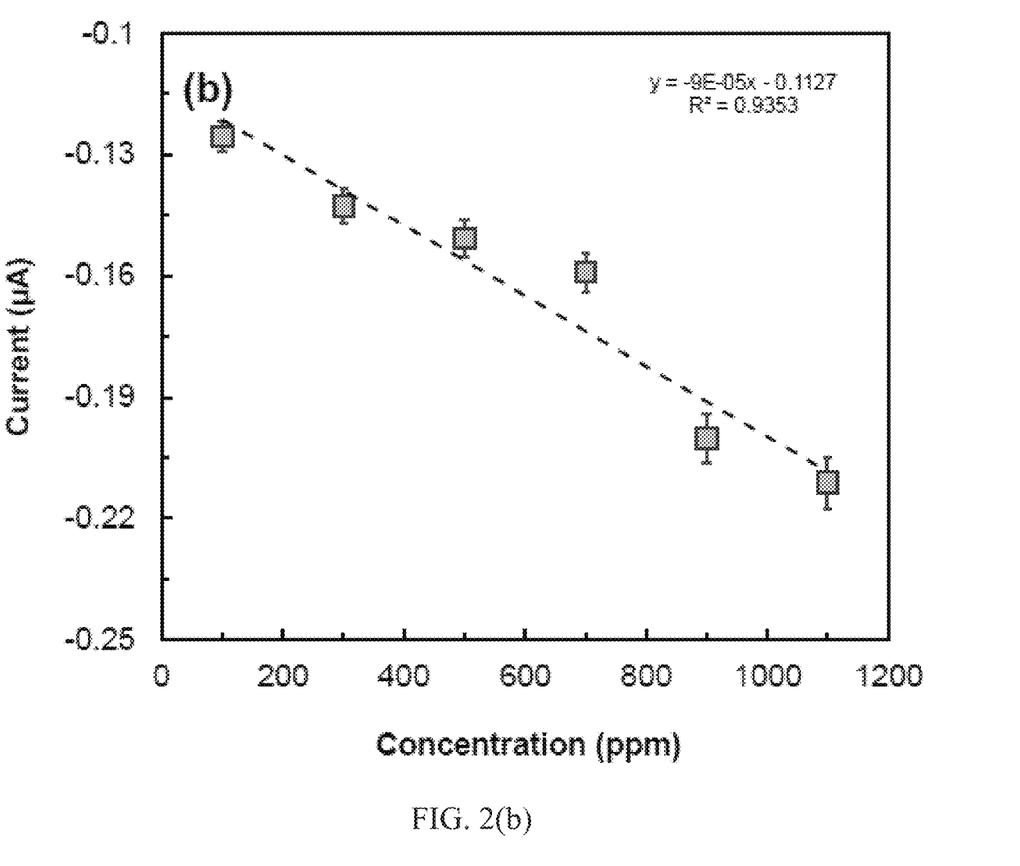
FIG. 2(b) shows a plot of current (in $\mu$A) versus concentration (in ppm), showing a calibration plot for IPA concentration and current.

Standardization of the measurements was performed via step by step evaluation. A steady-state study of the sensor response for various concentrations of IPA was performed (e.g., FIG. 2(a) shows a plot of current versus time for 800 parts per million (ppm) of IPA. Calibration plots were constructed, and the sensitivity was understated; and then the sensor response was studied for low concentrations of IPA. The amperometric method was used to study the fuel cell sensor's properties. The experimental setup included a chamber with a liquid IPA solution at the bottom and a closed headspace at the top. The sensor was housed at the top of the chamber to receive IPA vapor. The IPA solution concentration was varied to obtain the various concentrations of IPA vapor. The experiment was executed at room temperature and pressure. As shown in FIG. 2(b), there was a linear response in the current with respect to voltage. The label "control" in FIG. 2(a) was measured in the absence of IPA vapor and at a humidity of greater than 90%. The linear plot in FIG. 2(b) is the plot of current versus IPA concentration obtained from FIG. 2(a) at the time interval of 800 seconds. The square data points (with error bars) in FIG. 2(b) demonstrate the current signals for six different concentrations (100 ppm-1100 ppm) of IPA. The experiments were repeated several times to obtain the deviation in current, which was ±30 nA. The calibration plot also demonstrated good linearity having a coefficient of the determinant (R2) of 93.63%. The sensitivity of the sensor was determined to be 45 pA/ppm/cm$^2$ (or about 45 pA/ppm/cm$^2$).

Referring again to FIG. 2(a), the signal of the fuel cell sensor gradually increased until a time of 600 seconds and then attained a steady-state current. Once attaining the steady-state current, it never went down as long as the IPA vapor was present on the anode surface of the sensor. This indicates that the sensor is stable and reliable for prolonged measurements. The sensitivity of the sensor stayed the same in both high and low concentrations of IPA vapor exposure.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein are incorporated by reference in their entirety, including all figures and tables, to the extent they are not inconsistent with the explicit teachings of this specification.

What is claimed is:

1. A fuel cell sensor, comprising:
a proton exchange membrane (PEM);
an anode disposed on a first surface of the PEM;
a cathode disposed on a second surface of the PEM opposite from the first surface; and
a reference electrode disposed on the first surface of the PEM,
the fuel cell sensor being flexible,
the anode being a thin-film anode having a thickness in a range of from 20 nanometers (nm) to 100 nm,
the cathode being a thin-film cathode having a thickness in a rang of from 20 nm to 100 nm,
the anode comprising a first surface facing the first surface of the PEM and a second surface opposite to the first surface of the anode, the second surface of the anode being completely exposed to the ambient environment, and
the cathode comprising a first surface facing the second surface of the PEM and a second surface opposite to the first surface of the cathode, the second surface of the cathode being completely exposed to the ambient environment.

2. The fuel cell sensor according to claim 1, the reference electrode being spaced apart from the anode.

3. The fuel cell sensor according to claim 1, a length of the cathode being the same as a length of the PEM, and a width of the cathode being the same as a width of the PEM.

4. The fuel cell sensor according to claim 1, a thickness of the PEM being at least five times larger than each of a thickness of the anode, a thickness of the cathode, and a thickness of the reference electrode.

5. The fuel cell sensor according to claim 1, a cross-section of the anode, taken in a direction parallel to the first surface of the PEM, having a parabolic shape.

6. The fuel cell sensor according to claim 5, the reference electrode being spaced apart from the anode by a minimum distance ($L_{gap}$).

7. The fuel cell sensor according to claim 1, the anode comprising platinum (Pt), gold (Au), nickel (Ni), ruthenium (Ru), an oxide of any of these, or any combination thereof, and
the cathode comprising Pt, Au, Ni, Ru, an oxide of any of these, or any combination thereof.

8. The fuel cell sensor according to claim 1, the anode comprising Au, and the cathode comprising Au.

9. The fuel cell sensor according to claim 1, the PEM comprising Nafion.

10. A sensing system, comprising:
the fuel cell sensor according to claim 1;
a processor in operable communication with the fuel cell sensor; and
a machine-readable medium in operable communication with the processor and having instructions stored thereon that, when executed by the processor, perform the following steps:
receiving sensing data of the fuel cell sensor;
performing a principal component regression (PCR) multivariate method to establish a relationship among response and predictor variables of calibration data of an analyte to be sensed by the fuel cell sensor;
performing a principal component analysis (PCA) to reduce redundancy and outliers of the predictor variables and to give PCA predictor variables and covariates;
converting the PCA predictor variables into latent variables; and
performing multiple regression steps among the covariates.

11. A method of sensing isopropyl alcohol (IPA), comprising:
providing an IPA solution to a lower portion of a chamber;
disposing the fuel cell sensor according to claim 1 in an upper portion of the chamber;
closing off the chamber;
allowing IPA vapor formed from the IPA solution to reach the fuel cell sensor; and
measuring a current through the fuel cell sensor to determine an IPA concentration in the IPA solution.

12. A method of fabricating a fuel cell sensor, the method comprising:
providing a proton exchange membrane (PEM); and
sputter-coating nanoparticles on the PEM to form an anode on a first surface of the PEM, a cathode on a second surface of the PEM, and a reference electrode on the first surface of the PEM spaced apart from the anode,
the fuel cell sensor being flexible,
the anode being a thin-film anode having a thickness in a range of from 20 nanometers (nm) to 100 nm,
the cathode being a thin-film cathode having a thickness in a range of from 20 nm to 100 nm,
the anode comprising a first surface facing the first surface of the PEM and a second surface opposite to the first surface of the anode, the second surface of the anode being completely exposed to the ambient environment, and
the cathode comprising a first surface facing the second surface of the PEM and a second surface opposite to the first surface of the cathode, the second surface of the cathode being completely exposed to the ambient environment.

13. The method according to claim 12, further comprising, before providing the PEM, cleaning the PEM by boiling the PEM in peroxide.

14. The method according to claim 12, a length of the cathode being the same as a length of the PEM,
a width of the cathode being the same as a width of the PEM,
a thickness of the PEM being at least five times larger than each of a thickness of the anode, a thickness of the cathode, and a thickness of the reference electrode, a cross-section of the anode, taken in a direction parallel to the first surface of the PEM, having a parabolic shape, and the reference electrode being spaced apart from the anode by a minimum distance ($L_{gap}$).

15. The method according to claim 12, the nanoparticles being gold (Au) nanoparticles, such that the anode comprises Au and the cathode comprises Au.

16. The method according to claim 12, the PEM comprising Nafion.

17. A fuel cell sensor, comprising:

a proton exchange membrane (PEM);

an anode disposed on a first surface of the PEM;

a cathode disposed on a second surface of the PEM opposite from the first surface; and a reference electrode disposed on the first surface of the PEM, the fuel cell sensor being flexible, a length of the cathode being the same as a length of the PEM, a width of the cathode being the same as a width of the PEM, a thickness of the PEM being at least five times larger than each of a thickness of the anode, a thickness of the cathode, and a thickness of the reference electrode, a cross-section of the anode, taken in a direction parallel to the first surface of the PEM, having a parabolic shape, the reference electrode being spaced apart from the anode by a minimum distance ($L_{gap}$)

the anode being a thin-film anode having a thickness in a range of from 20 nanometers (nm) to 100 nm, the cathode being a thin-film cathode having a thickness in a range of from 20 nm to 100 nm, the anode comprising a first surface facing the first surface of the PEM and a second surface opposite to the first surface of the anode, the second surface of the anode being completely exposed to the ambient environment, the cathode comprising a first surface facing the second surface of the PEM and a second surface opposite to the first surface of the cathode, the second surface of the cathode being completely exposed to the ambient environment, the anode comprising gold (Au), the cathode comprising Au, and the PEM comprising Nafion.

18. A sensing system, comprising:

the fuel cell sensor according to claim 17;

a processor in operable communication with the fuel cell sensor; and a machine-readable medium in operable communication with the processor and having instructions stored thereon that, when executed by the processor, perform the following steps:

receiving sensing data of the fuel cell sensor;

performing a principal component regression (PCR) multivariate method to establish a relationship among response and predictor variables of calibration data of an analyte to be sensed by the fuel cell sensor;

performing a principal component analysis (PCA) to reduce redundancy and outliers of the predictor variables and to give PCA predictor variables and covariates;

converting the PCA predictor variables into latent variables; and performing multiple regression steps among the covariates.

19. A method of sensing isopropyl alcohol (IPA), comprising:

providing an IPA solution to a lower portion of a chamber;

disposing the fuel cell sensor according to claim 17 in an upper portion of the chamber;

closing off the chamber;

allowing IPA vapor formed from the IPA solution to reach the fuel cell sensor; and measuring a current through the fuel cell sensor to determine an IPA concentration in the IPA solution.

* * * * *